United States Patent [19]

Benn, Sr. et al.

[11] Patent Number: 5,107,070
[45] Date of Patent: Apr. 21, 1992

[54] DUAL ELASTOMER GASKET FOR PROTECTION AGAINST MAGNETIC INTERFERENCE

[75] Inventors: Robert C. Benn, Sr.; Robert C. Benn, Jr., both of Danbury, Conn.

[73] Assignee: Vanguard Products Corporation, Danbury, Conn.

[21] Appl. No.: 566,579

[22] Filed: Aug. 13, 1990

Related U.S. Application Data

[63] Continuation-in-part of Ser. No. 269,350, Nov. 10, 1988, Pat. No. 4,968,854.

[51] Int. Cl.$^5$ ............................................. H05K 9/00
[52] U.S. Cl. ........................ 174/35 GC; 219/10.55 D
[58] Field of Search ..................... 174/35 GC, 35 R; 219/10.55 D

[56] References Cited

U.S. PATENT DOCUMENTS

| | | | |
|---|---|---|---|
| Re. 33,256 | 7/1990 | Busby | 174/35 GC |
| 3,446,906 | 5/1969 | Zulauf | 174/35 GC |
| 3,576,387 | 4/1971 | Derby | 174/36 |
| 3,783,173 | 1/1974 | Twomey | 174/35 GC |
| 3,866,009 | 2/1975 | Ishino et al. | 219/10.55 D |
| 3,879,595 | 4/1975 | Lamb | 219/10.55 D |
| 4,011,360 | 3/1977 | Walsh | 174/35 GC X |
| 4,046,983 | 9/1977 | Ishino et al. | 219/10.55 D |
| 4,399,317 | 8/1983 | Van Dyk, Jr. | 174/35 GC |
| 4,602,141 | 7/1986 | Naito et al. | 219/10.55 D |
| 4,659,869 | 4/1987 | Busby | 174/35 GC |
| 4,777,205 | 10/1988 | La Scola et al. | 252/503 X |
| 4,960,633 | 10/1990 | Hiza et al. | 219/10.55 D X |
| 4,968,854 | 11/1990 | Benn, Sr. et al. | 174/35 GC |
| 4,977,295 | 12/1990 | Chin et al. | 174/35 GC |

FOREIGN PATENT DOCUMENTS

| | | |
|---|---|---|
| 1116650 | 1/1982 | Canada . |
| 2222913A | 3/1990 | United Kingdom . |

OTHER PUBLICATIONS

Crosby, E. G. and Nuccio, C., "Conductive Seal for Electromagnetic Shielding in Electrical Enclosure"; IBM Technical Disclosure Bulletin, vol. 20, No. 1, Jun. 1977, pp. 282-283.

*Primary Examiner*—Morris H. Nimmo
*Attorney, Agent, or Firm*—Browdy and Neimark

[57] ABSTRACT

An improved gasket shielding against magnetic waves is provided in the form of an integral two-layer component including a support layer and a cover layer, the support layer being strong and having excellent physical properties, and the cover layer being filled with ferrite or magnetite or the like.

19 Claims, 1 Drawing Sheet

DUAL ELASTOMER GASKET FOR PROTECTION AGAINST MAGNETIC INTERFERENCE

FIELD OF INVENTION

This is a CIP of co-pending parent application Ser. No. 07/269,350, filed Nov. 10, 1988, U.S. Pat. No. 968,854, the contents of which are hereby incorporated by reference.

The present invention relates to the shielding of various types of equipment, such as electronic equipment, to protect same against magnetic interference. It specially concerns gaskets for cabinet enclosures or the like, which cabinets are adapted to receive various types of magnetic sensitive equipment which shold be shielded against magnetic interference, the gaskets serving to shield the contents of the cabinet from damage due to exterior magnetic interference.

BACKGROUND OF THE INVENTION

Producers of commercial electronic equipment, not to mention defense applications, are being forced to improve the performance of shielding devices to counteract electromagnetic interference complicated by the ever higher frequencies of energy generation in and beyond the megahertz range. Openings in cabinet enclosures for access doors, hinges, etc. must be so protected by the use of suitable shielding.

This has been an ongoing problem and various solutions have been proposed, these prior solutions however being unsatisfactory from one or more points of view. Thus, the prior devices have been insufficient from point of view of at least one or more of the following requirements:

(1) Attenuation of internal and external interferences using gasketing with resistive values with the range of 0.1 to 0.001 ohm-cm and selectable attenuation form 30 to 90 dB.

(2) Low compression set of the gasket so long term mechanical sealing is maintained.

(3) Superior physical properties of the gasket to prevent failure due to tearing forces.

(4) Resistance to reduced electromagnetic shielding due to oxidation.

(5) Ease of cleanliness maintenance.

(6) Freedom from free metal chips as occurs with the initial fitting and subsequent deterioration of metallic meshes and metal assemblies.

(7) A neat appearance of the shield.

(8) Ease of installation and replacement.

(9) Low cost relative to alternate designs. There are presently available four different types of cabinet shielding means which suffer one or more defects. These are as follows:

| Product | Principal Inadequacy |
| --- | --- |
| (1) Carbon Filled Elastomers | Shielding ability falls off in the higher frequency range |
| (2) Metal Filled Elastomers | Poor physical properties (compression set, tear, etc.) |
| (3) Metal Mesh with Elastomeric Core | Hard to cut cleanly for corners; chips of free metal |
| (4) Metallic Seals (Spring-like fingers) | Difficult to keep clean, oxidation |

In addition, it is to be noted that most metals are problematic in shielding against magnetic waves unless the metals are in extremely thick layers.

SUMMARY OF THE INVENTION

It is, accordingly, an object of the present invention to overcome deficiencies in the prior art.

It is another object of the present invention to provide an improved gasket shielding material for protection against magnetic waves.

It is yet another object of the present invention to provide dual elastomer gasket shielding for counteracting magnetic interference.

These and other objects are achieved according to the present invention by the provision of an elastomeric gasket formed in two layers, such as by dual extrusion, in the form of a support layer having good strength and other physical properties including good strength, and a relatively thin coating layer containing ferrite or magnetite materials or the like having excellent ability to counteract or attenuate magnetic waves.

The above and other objects and the nature and advantages of the present invention will be more apparent from the following detailed description of certain specific embodiments thereof, as disclosed below.

BRIEF DESCRIPTION OF DRAWING

FIG. 1 shows an EMI gasket 10 of typical configuration, but in accordance with the present invention, having a metal clip part 12 and a rubber gasket part 14 adhered together. FIGS. 2a-2f show various other typical forms which may be used.

Figure 1:
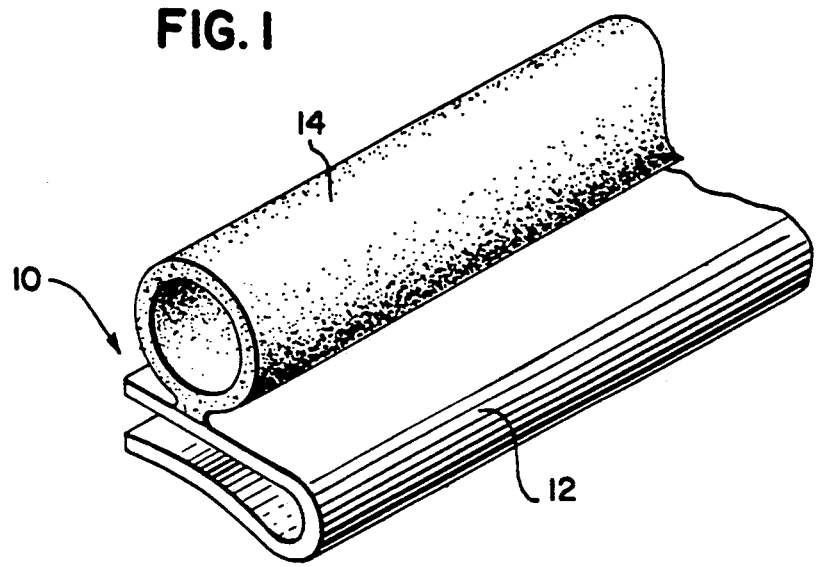
FIG. 1 is a perspective view of an EMI gasket configuration to which the subject of the present invention may be applied.
Figure 2A:
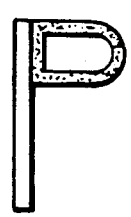
FIGS. 2a-2f are end views of other possible configurations, FIG. 2d being somewhat similar to the embodiment of FIG. 1.
Figure 2B:
Figure 2C:
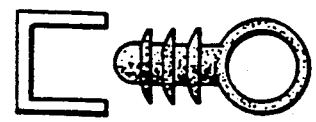
Figure 2D:
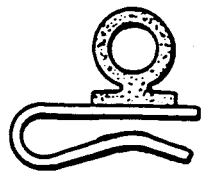
Figure 2E:
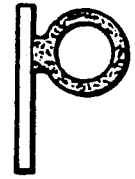
Figure 2F:
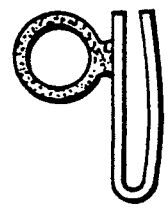
Figure 3:
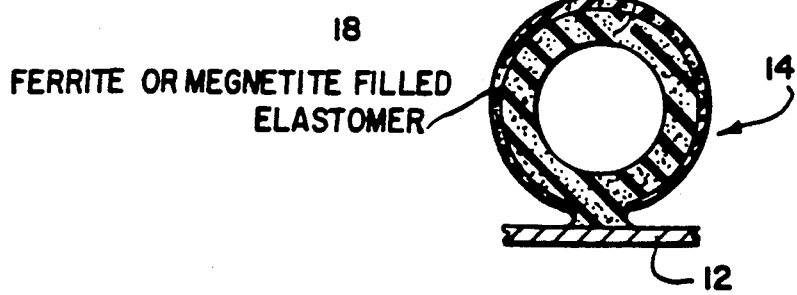
FIG. 3 is an enlarged partial cross-sectional view of the gasket of FIG. 1.

In accordance with the present invention, the gasket part 14 is formed of a non-metallic, yet preferably conductive, elastomeric inner portion 16 to which is permanently bonded, preferably by co-extrusion within the die, an outer sheathing or covering 18 of either ferrite- or magnetite-filled elastomer. From the embodiment of FIGS. 1, 3, 2a, 2b, and 2d-2f, it will be understood that such a gasket may be co-extruded and bonded during extrusion onto metallic and conductive non-metallic shapes for convenient assembly to cabinets. From FIG. 2c, it will be understood that the gasket material can be provided in other shapes which can be subsequently attached to a suitable substrate. In general, the extrusions are made in continuous length, shaped to any desired uniform cross-section.

The product can be formed onto a metallic carrier, for example a flat metal strip (see FIGS. 2a, 2e and 2b) or a roll-formed shape (FIGS. 2d and 2f) by passing the metal substrate through the co-extrusion tooling in a continuous process. The inner portion 16 is chemically locked to the metallic layer thus ensuring transmission of electrical energy unimpeded between the co-elastomer and the metallic carrier.

The inner layer 16 is constructed of a strong elastomeric material which has good physical properties, including high tear resistance, as well as the ability to recover shape after deformation, i.e. good elasticity. This material is desirably carbon filled rubber.

The magnetic material filled exterior covering 18 provides a high degree of counteracting of magnetic energy than presently available non-filled elastomeric shielding. On the other hand, such magnetite/ferrite filled elastomer gasket material used alone as a shielding material suffers from poor physical properties, including low tearing resistance, and its recovery of shape after deformation is poor. The magnetite/ferrite particle filler does not reinforce the elastomer and acts as a diluent.

By chemically bonding a magnetite or ferrite-filled elastomer 18 to a carbon-filled elastomer substrate 16, the tear resistance and compression recovery of the gasket 14 substantially improved. In addition, the shielding effectiveness is substantially improved over the use of carbon-filled rubber alone. The product is easily cleaned to maintain shielding effectiveness and presents a neat appearance.

When the two elastomers 16 and 18 are simultaneously bonded under the pressure of co-extrusion, the unity of the resultant gasket is assured and electrical and physical results are optimum.

It will be understood that both layers 16 and 18 serve to counteract magnetic interference, except that the outer layer 18 is considerably more effective in this regard while the inner layer 16 is less shielding-effective but much stronger and with better physical properties. They are bonded by co-extrusion in a molecular sharing way, and thus provide a superior electrical shield over either one used alone.

The inner layer 16 is substantially thicker than the outer coating, preferably on the order of 5 to 20 times as thick when such layer 16 is hollow as preferred, preferably at a thickness ratio of 10:1, the outer coating 18 desirably being 2-8 mils thick and the inner support layer 16 being 5-160 mils thick, preferably 20-80 mils thick.

The inner support layer may be formed of a variety of elastomers, but preferably it comprises an elastomeric silicone polymer containing fumed silica and carbon black as reinforcers, plus a suitable cross-linking agent. Alternatively, the inner layer 16 may be composed of a non-conductive silicone elastomer, such as one comprising silicone gum, fumed silica and a cross-linking agent.

As in patent application Ser. No. 07/269,350 now U.S. Pat. No. 4,968,854, the rubber matrix is preferably silicone rubber, although other elastomeric materials can be used such as, for example, natural rubber, nitrile rubber, or epichlorohydrin rubber. As in patent application Ser. No. 07/269,350, now U.S. Pat. No. 4,968,854, gaskets of the present invention are preferably formed by co-extrusion. The extrusion head is desirably subjected to a magnetic field so that as the outer layer leaves the die and becomes solidified, the ferrite and/or magnetite particles which constitute the main functional filler are aligned into position for polarity.

The quantity of ferrite and/or magnetite in the outer layer composition is subject to wide variation, but in general may comprise from 0.5 to 6 parts by weight, or even more, per part by weight of elastomer matrix. The quantity of ferrite and/or magnetite must not be so low as to result in insufficient magnetic protection, nor so high that the outer layer becomes brittle and/or inflexible.

Gaskets produced according to the present invention shield against magnetizing field force at 200 kHz, and provide 110 dB attenuation as per military standard D-285. Gaskets according to the present invention provide the user who is concerned with magnetic protection a highly flexible strong, elastomeric gasket material not previously available and at a lower cost. Gaskets according to the present invention are not intended for use in frequency fields substantially higher than 200 kHz, as at such higher frequencies the present magnetic gaskets will not provide good attenuation; instead, at such higher frequencies the gaskets exemplified in patent application Ser. No. 07/269,350 now U.S. Pat. No. 4,968,854, are preferred.

The following example is offered illustratively:

EXAMPLE

Suitable gasket material is made using inner core material as disclosed in patent application Ser. No. 07/269,350, now U.S. Pat. No. 4,968,854, and co-extruding therewith as an outer coating a composition as set forth in Table 1 below.

TABLE 1

| | |
|---|---|
| 100 pbw | Silicone reinforced gum |
| 400 pbw | M $Fe_{12}O_{19}$ (M is a divalent metal ion such as Ba or Sr) |
| 2 pbw | Organic peroxide (dicumyl or 2,4 dichlorobenzoyl types) |
| 1-3 pbw | Colorant, as needed |
| 0.2-1.0 pbw | Dispersant aids |

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation

What is claimed is:

1. In a gasket shield for counteracting magnetic interference comprising a flexible gasket element, the improvement wherein said gasket element comprises a relatively thick elastomeric inner layer of good elasticity and strength, and a very thin outer layer integral therewith, said outer layer comprising a synthetic polymeric material filled with ferrite, magnetite or a mixture thereof aligned in position for polarity, and providing shielding against magnetic waves.

2. A gasket shield according to claim 1, wherein said inner layer is conductive.

3. A gasket shield according to claim 2, wherein said inner and outer layers are formed of rubber, and said inner layer carbon-filled.

4. A gasket shield according to claim 1, wherein said inner layer is on the order ten times thicker than said outer layer.

5. A gasket shield according to claim 1, wherein said inner and outer layers are chemically bonded to one another.

6. A gasket shield according to claim 1, wherein said inner and outer layers are co-extruded.

7. A gasket shield according to claim 1, further comprising a metallic substrate chemically locked thereto.

8. A gasket shield according to claim 1 wherein said outer layer has a thickness of no greater than about 8 mils.

9. A gasket shield according to claim 1 wherein said layer has a thickness of about 2-8 mils.

10. A gasket shield according to claim 4 wherein said inner layer has a thickness of no greater than about 8 mils.

11. A gasket shield for counteracting magnetic wave comprising a flexible gasket element having a relatively thick elastomeric inner layer of good elasticity and strength, and a very thin flexible outer layer integral therewith, said outer layer being filled with ferrite, magnetite or a mixture thereof aligned in position for polarity.

12. A gasket shield according to claim 11 wherein said outer layer has a thickness of no greater than about 8 mils.

13. A gasket shield according to claim 12 wherein said inner layer is on the order of 10 to 20 times thicker than said outer layer.

14. A gasket shield according to claim 11 wherein said inner and outer layers are formed of cross-linked rubber.

15. A gasket shield according to claim 11 wherein said inner and outer layers are formed of silicone rubber.

16. A gasket shield according to claim 15 wherein said inner layer comprises a non-conductive, fumed silica reinforced silicone rubber.

17. A gasket shield according to claim 15 wherein said inner layer comprises a conductive, carbon-black and fumed silica reinforced silicone rubber.

18. A gasket shield according to claim 15 wherein said inner layer is on the order of 10 to 20 times thicker than said outer layer.

19. A gasket shield according to claim 11 wherein said outer layer has a thickness of about 2-8 mils.

* * * * *